United States Patent
Legel et al.

(10) Patent No.: US 9,248,941 B1
(45) Date of Patent: Feb. 2, 2016

(54) RACK-HANDLING SYSTEM

(71) Applicant: Amazon Technologies, Inc., Reno, NV (US)

(72) Inventors: Laura Lynn Legel, Seattle, WA (US); John William Eichelberg, Spokane, WA (US); Michael Phillip Czamara, Seattle, WA (US); Christopher Wayne Turner, Ashburn, VA (US)

(73) Assignee: Amazon Technologies, Inc., Reno, NV (US)

(*) Notice: Subject to any disclaimer, the term of this patent is extended or adjusted under 35 U.S.C. 154(b) by 31 days.

(21) Appl. No.: 13/849,077

(22) Filed: Mar. 22, 2013

(51) Int. Cl.
*B65G 7/12* (2006.01)
*B65D 25/28* (2006.01)

(52) U.S. Cl.
CPC ...................................... *B65D 25/28* (2013.01)

(58) Field of Classification Search
CPC .......... B65G 7/12; A47J 45/10; A47J 45/077; B66C 1/46; A45F 5/10; A45F 5/1026; A45F 3/16; A45F 5/00; B65D 25/28
USPC ............. 294/15, 27.1, 31.2, 119.2, 154, 165; 224/148.5, 148.6
See application file for complete search history.

(56) References Cited

U.S. PATENT DOCUMENTS

| | | | | |
|---|---|---|---|---|
| 1,243,638 | A | * | 10/1917 | Spurrier .......................... 294/154 |
| 2,775,476 | A | * | 12/1956 | Brown ............................. 294/29 |
| 4,230,355 | A | * | 10/1980 | Petrunich ........................ 294/15 |
| 4,527,823 | A | * | 7/1985 | Straus ............................. 294/16 |
| 5,863,056 | A | * | 1/1999 | Hostetter ................. 280/47.371 |
| 6,974,294 | B2 | | 12/2005 | Pressman et al. |
| 7,311,343 | B2 | * | 12/2007 | Callebresi ....................... 294/15 |
| 8,113,478 | B2 | | 2/2012 | Hsiao |
| 2006/0274508 | A1 | | 12/2006 | LaRiviere et al. |
| 2007/0120386 | A1 | * | 5/2007 | Benysh et al. ................. 294/153 |

* cited by examiner

*Primary Examiner* — Stephen Vu
(74) *Attorney, Agent, or Firm* — Robert C. Kowert; Meyertons, Hood, Kivlin, Kowert & Goetzel, P.C.

(57) ABSTRACT

A rack-handling system includes a rack-handling device having a rack-coupling portion and one or more handles. The rack-coupling portion can be coupled with a rack. The handles can be gripped by a user to move the rack from one location to another when the rack-coupling portion is coupled to the rack.

19 Claims, 7 Drawing Sheets

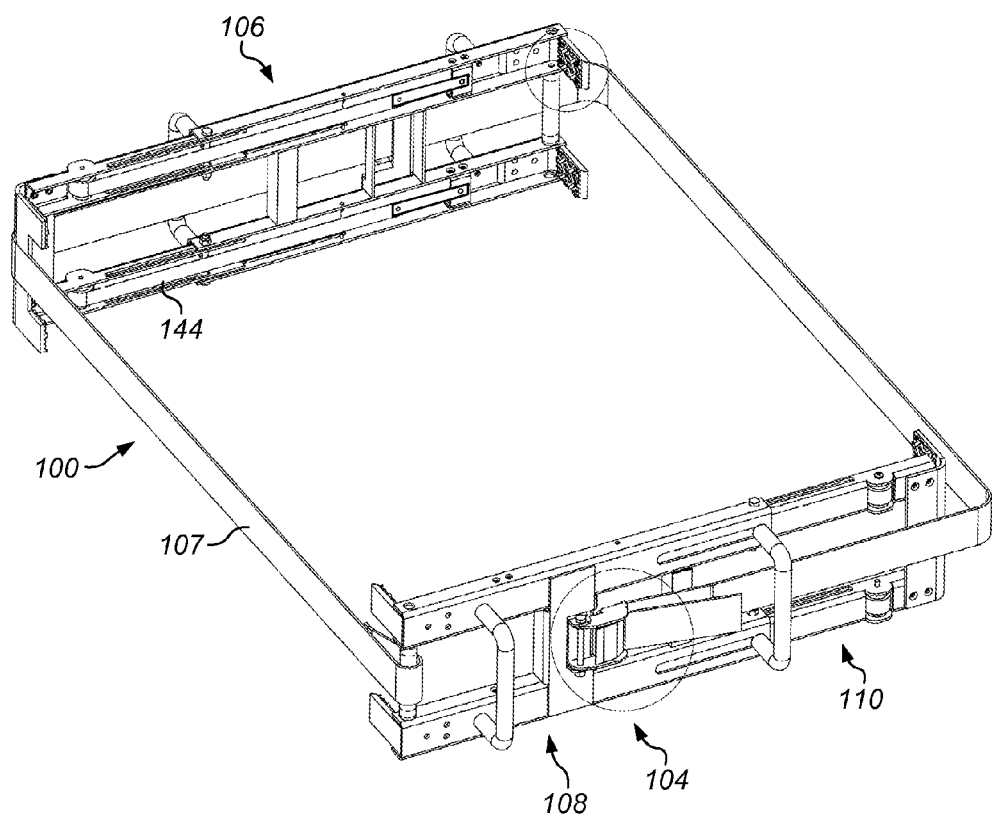
FIG. 2
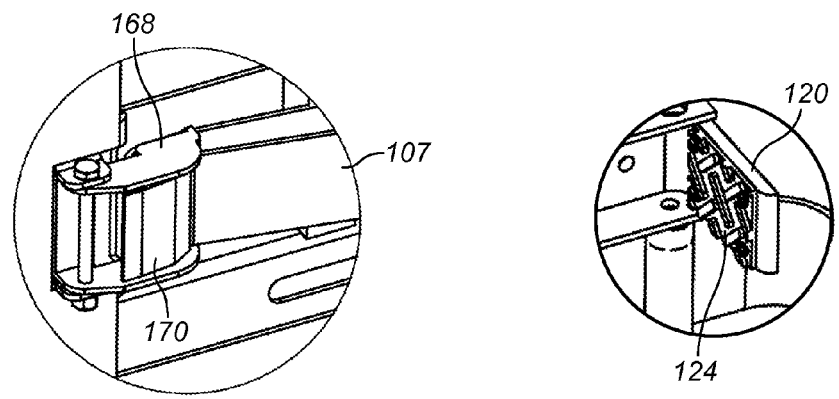
FIG. 3
FIG. 4

RACK-HANDLING SYSTEM

BACKGROUND

Many companies and other organizations operate computer networks that interconnect numerous computing systems to support their operations and the services they provide to their end customers distributed worldwide. For example, data centers housing significant numbers of interconnected computing systems have become commonplace, such as private data centers that are operated by and on behalf of a single organization, and public data centers that are operated by entities as businesses to provide computing resources to customers.

Racks in a data center sometimes need to be moved from one place to another within a computing room. A rack having a full complement of servers, power supply components, network components, or other systems may be quite heavy. Often, racks are mounted on casters to facilitate moving the rack on the floor of the computing room. Because many racks may be held in close proximity to one another, however, service personnel may encounter hazards when working with the rack being moved. For example, a person's hand may be smashed or pinched between the rack being extracted from a row of racks and an adjacent rack. In addition, some techniques for moving racks involve applying loads to various parts of the structure of a rack in a manner that can deform the rack structure. For example, in an open frame rack, pulling the rack by a single vertical corner post may bend the corner post.

BRIEF DESCRIPTION OF THE DRAWINGS

FIG. 2 illustrates one embodiment of a rack-handling system with front and rear handles.

FIG. 3 illustrates a detail view illustrating one embodiment of a cam buckle mechanism of a rack-handling device.

FIG. 4 is a detail view showing an end tab on a rack-handling device.

Figure 1:
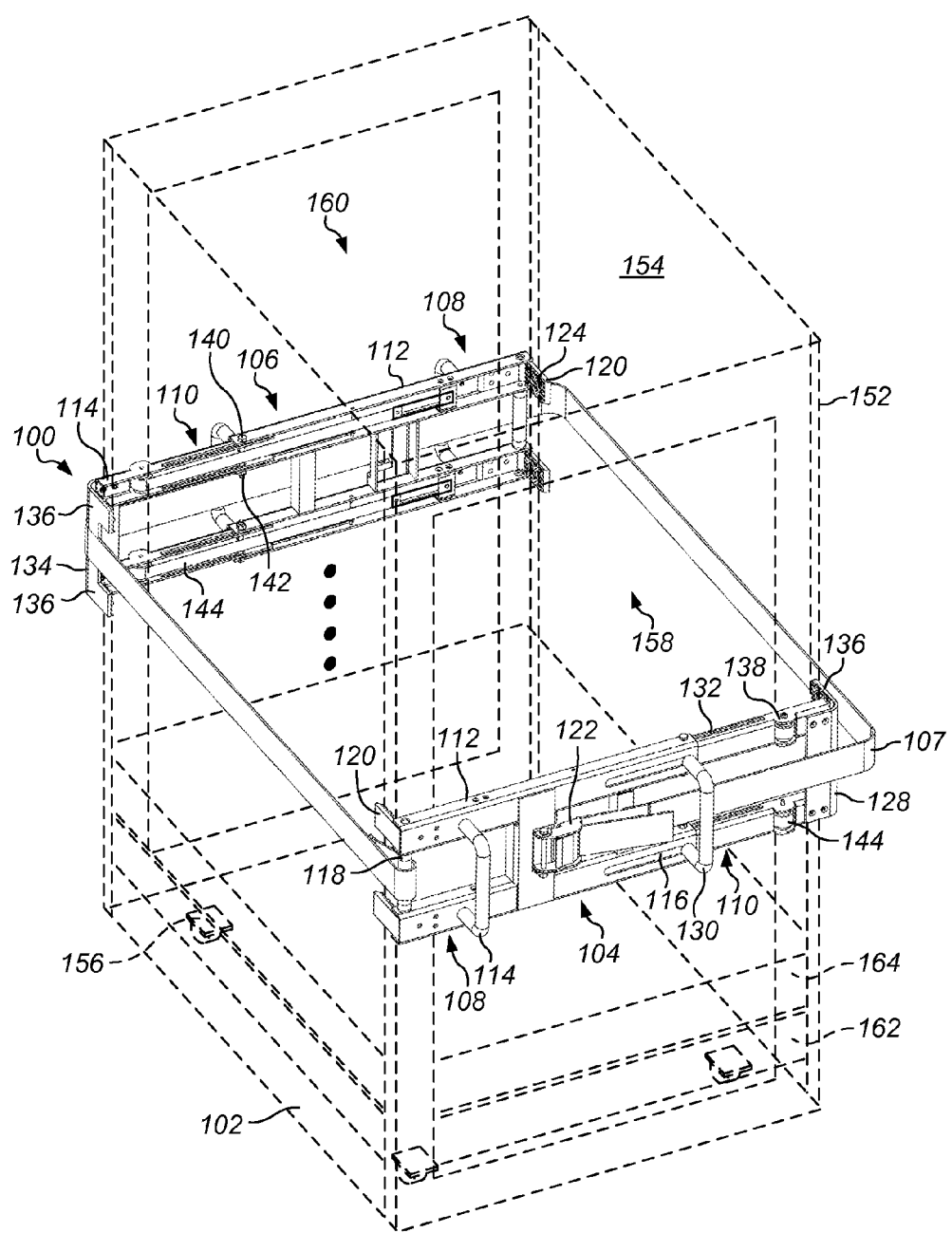
FIG. 1 illustrates one embodiment of a rack-handling system with front and rear handles installed on a rack.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of methods and apparatus for systems and methods for moving racks are described. According to one embodiment, a rack-handling system includes rack-handling devices and a flexible member (such as a strap). The rack-handling devices include a rack-coupling portion and one or more handles. The flexible member couples with the rack-handling devices when the rack-handling devices are mounted on opposing ends of the rack. The flexible member inhibits separation of the rack-handling devices from the rack when the rack-handling devices are used to move the rack.

According to one embodiment, a rack-handling system includes a rack-handling device with a rack-coupling portion and one or more handles. The rack-coupling can be coupled with a rack. The handles can be gripped by a user to move the rack from one location to another when the rack-coupling portion is coupled to the rack.

According to one embodiment, a rack-handling system includes rack-handling devices and one or more linking members. The linking members can be coupled with the rack-handling devices when the two rack-handling devices are mounted on the rack. The linking members link the rack-handling devices with one another. The linking members inhibit separation of the two rack-handling devices from the rack when one or both of the rack-handling devices are used to move the rack.

According to one embodiment, a method of moving a rack from one location to another includes attaching one or more rack handling devices including handles to the rack. The handles are located such that the handles are between a left boundary plane and a right boundary plane of the rack when the rack handling device are installed. The handles are used to move the rack from one location to another.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to devices including a processor, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "rack" means a system that includes one or more electrical systems supported by a common structure. The structure of a rack may include a frame, a cabinet, shelves, rails, or combinations thereof.

In some embodiments, a rack-handling system includes rack-handling devices that mount on opposing ends of a rack (for example, front and back). The rack-handling devices include rack-coupling portions (which may be, for example, adjustable bracket assemblies) that couple to the rack, and handles. A flexible member spans between the opposing ends of the rack and helps keep the rack-handling devices in place on the rack. The handles may be used to move the rack from one location to another.

In some embodiments, a rack-handling system includes rack-handling devices that mount on a rack (for example, front and back). A linking member (for example, a strap, cable, rod, or trip) links rack-handling devices with one another and/or helps keep the rack-handling devices in place on the rack.

FIG. 1 illustrates one embodiment of a rack-handling system with front and rear handles. Rack-handling system 100 is installed on rack 102. Rack-handling system 100 includes front rack-handling device 104, rear rack-handling device 106, and strap 107.

Front rack-handling device 104 and rear rack handling devices 106 include left bracket assembly 108 and right bracket assembly 110. Left bracket assembly 108 and right bracket assembly 110 may serve as rack-coupling portions of front rack-handling device 104 and rear rack handling devices 106. On each rack-handling device, left bracket assembly 108 and right bracket assembly 110 may slide with respect to one another such that the span between the opposing left and right tabs can be adjusted. Thus, front rack-handling device 104 and rear rack handling devices 106 can each be adjusted to bracket racks of differing widths. For example, front rack-handling device 104 and rear rack handling devices 106 may each be adjustable to span racks ranging in width from 22 inches to 27 inches.

Left bracket assembly 108 includes left bracket 112, left handle 114, exterior slots 116, strap post 118, end tabs 120, and cam buckle mechanism 122. Right bracket assembly 110 includes right bracket 128, right handle 130, interior slots 132, strap-bearing rim 134, end tabs 136, and spring carrier block 138.

Left bracket assembly 108 and right bracket assembly 110 may be coupled to one another by way of a sliding connection. At each the upper and lower positions, bolt 140 passes through a hole in the upper rim of left bracket 112, then through upper and lower interior slots 132 of right bracket 128, and then through a second hole in the lower rim of bracket 112. Bolt 140 may be held in place by nut 142. The shank of bolt 140 may slide back and forth in interior slots 132 of right bracket 128. Thus, a pinned connection may be formed in interior slots 132. Right handle 128 may slide in exterior slots 116.

Left bracket assembly 108 and right bracket assembly 110 are also connected by spring 144. A coiled end of spring 144 is held on spring carrier block 138 of right bracket assembly 110. The other end of spring 144 is attached to left bracket 112. Spring 144 may bias left bracket 112 and right bracket 128 to slide together, such that end tabs 120 on right bracket 128 and end tabs 136 on left bracket 112 are drawn toward one another by the spring force. Spring 144 may be, in one embodiment, a constant force spring. In this case, spring 144 may exert a constant (or nearly constant) biasing force regardless of how far apart left bracket assembly 108 and right bracket assembly 110 are spread.

Pads 124 are installed on the interior faces of end tabs 120 and end tabs 136. When front rack-handling device 104 and rear rack handling devices 106 are placed on rack 102, pads 124 may engage on the exterior sides of rack 102 near the corners of rack 102.

Rack 102 includes rack frame 152, cabinet 154, casters 156, front rack opening 158, and rear rack opening 160. Computing devices or other electrical systems may be installed in rack 102, such as computing devices 162 and 164 mounted in rack frame 152 of rack 102. In some embodiments, front rack-handling device 104 and rear rack handling device 106 are installed on an open frame rack. In certain embodiment, pads 124 on end tabs 120 and end tabs 136 engage (directly or indirectly) on a frame structure (for example, vertical corner posts of the rack).

When rack-handling system 100 is installed on rack 102, left handles 114 and right handles 130 are located such that a user can use the handles to move rack 102 with the user's hand between the sides of the rack. For example, the user's hands and arms may not need to break a vertical plane formed by the rack posts when gripping either the right handle or the left handle.

Strap 107 links front rack-handling device 104 and rear rack handling device 106. Strap 107 may be, in one embodiment, made of nylon. Strap 107, in combination with front rack-handling device 104 and rear rack handling device 106, create a rack-handling system that goes all the way around the structure of rack 102. Strap 107 may inhibit separation of rack-handling device 104 and rear rack handling device 106 when the rack-handling devices are used by service personnel to move rack 102 from one location to another. One end of strap 107 is secured to strap post 118 of left bracket assembly 108. Strap 107 passes to the rear of rack 102, onto strap-bearing rim 134, under right handle 130 and left handle 114, and then passes around the far corner of rack 102 and returns to the front of rack 102. The end of strap 107 may be secured in cam buckle 166 on front rack-handling device 104. Once strap 107 is engaged in cam buckle 166, service personnel may pull on the end of strap 107 to impart tension into strap 107, and then lock down the cam buckle to lock in the tension level of strap 107.

In the embodiment described above relative to FIG. 1, rack-handling devices on opposing ends of a rack are connected by way of a strap. Rack-handling devices may nevertheless in some embodiments be connected by other types of linking elements or systems. Other types of flexible members, for example, may be used to link rack-handling devices. Examples of flexible members that may be used to link rack-handling devices include a cord, a cable, a rope, or a chain. In certain embodiments, rack-handling devices are connected by a rigid member, such as a rod, a bar, a bracket, or a sheet metal strip.

In some embodiments, a flexible member may be used to secure a single rack-handling device to a rack. For example, in one embodiment, rear rack handling device 106 may be omitted, and strap 107 may be pulled into tension directly around the cabinet or frame of rack 102.

FIG. 2 illustrates rack-handling system 100 with the rack removed for clarity. FIG. 3 illustrates a detail view of one embodiment of a cam buckle mechanism. Cam buckle mechanism 122 includes base 168 and locking lever 170. Locking lever 170 may be pressed down to actuate cam to apply pressure on strap 107.

Although in the embodiment described above relative to FIGS. 1-3, a rack-handling system includes a cam-lock mechanism, other mechanisms may be used to create or hold tension on a linking member of a rack handling system. In one embodiment, for example, a rack-handling device includes a ratchet mechanism that can be turned by a user to ratchet up tension on a chain or cable.

FIG. 4 is a detail view illustrating an end tab on a rack-handling device. Pad 124 is installed on the interior face of end tab 120 of the rack-handling device. In some embodiments, pads 124 include an elastomeric material, such as rubber. Pad 124 may bear against a portion of a rack when the rack-handling device is installed on the rack.

Figure 5A:
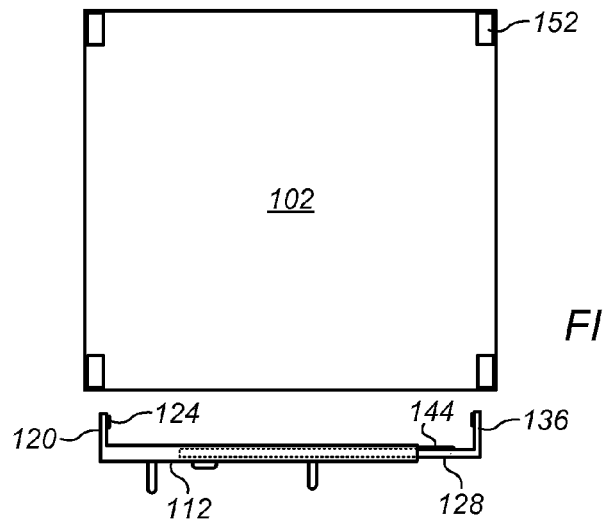
FIGS. 5A through 5C illustrate installation of a rack-handling device on a rack.
Figure 5B:
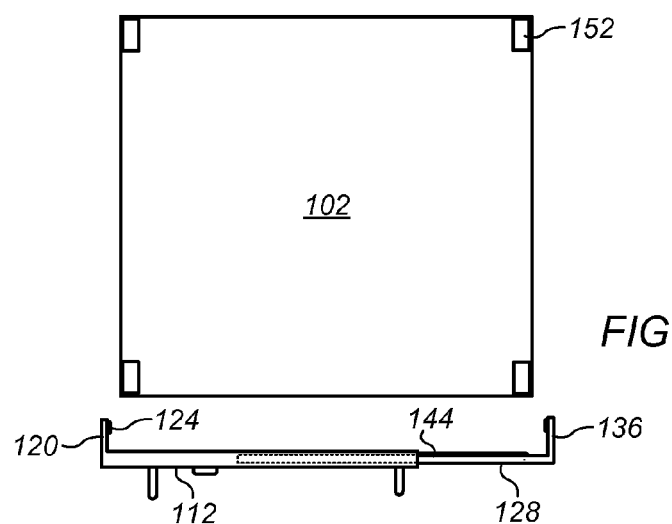
Figure 5C:
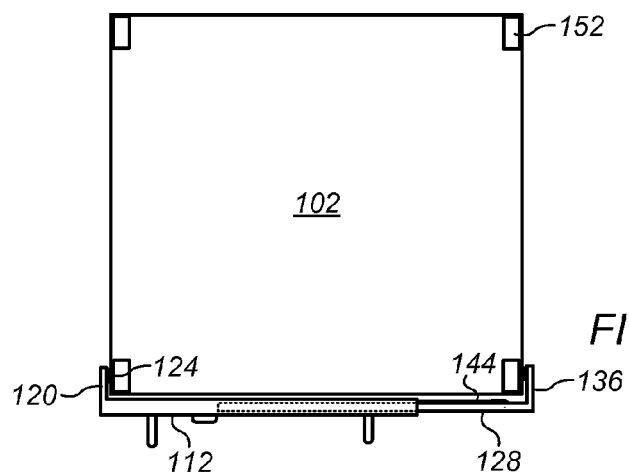

FIGS. 5A through 5C illustrate installation of a rack-handling device on a rack. As noted above, spring 144 may bias left bracket 112 and right bracket 128 to slide further together, such that end tabs 120 on right bracket 128 and end tabs 136 on left bracket 112 are drawn toward one another by the spring force.

Before installation on rack 102, the span between opposing end tabs 120 and end tabs 136 of front rack-handling device 104 may be narrower than the width of rack 102, such as shown in FIG. 5A. A user may manually spread left bracket 112 and right bracket 128 via the slotted connection between left bracket 112 and right bracket 128, to the point where the span between opposing end tabs 120 and end tabs 136 of front rack-handling device 104 is wider than the width of rack 102, such as shown in FIG. 5B. In some embodiments, the user manually spreads the brackets by pulling apart the handles on the brackets.

Once the opposing end tabs 120 and end tabs 136 are sufficiently spaced apart, the user may place front rack-handling device 104 on the front of rack 102 and stop applying the spreading force on the left and right brackets. Once the user is no longer applying a spreading force against spring 144, spring 144 urges opposing end tabs 120 and end tabs 136 into contact with the sides of rack 102, such as to the position shown in FIG. 5C. The pressure applied by spring force may inhibit rack-handle from separating from rack 102 during installation of a linking strap, during use of the rack-handling device 104 to move rack 102, or both. Front rack-handling device 104 and rear rack handling device 106 (and their associated handles) may be removed and reinstalled from rack 102 as needed.

Figure 6A:
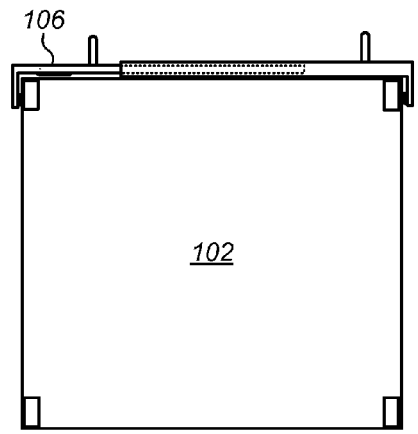
FIGS. 6A through 6D illustrate installation of a rack-handling system on a rack.

FIGS. 6A through 6D illustrate installation of a rack-handling system on a rack. Rear rack-handling device 106 may be installed on the rear of rack 102, such as shown in FIG. 6A. (The approach used to install rear rack-handling device 106 may be the same as that described above relative to FIGS. 5A through 5C.) Once rear rack-handling device 106 is in place on rack 102, spring force may maintain rear rack-handling device 106 in position during installation of the remaining components of rack-handling system 100.

Figure 6B:
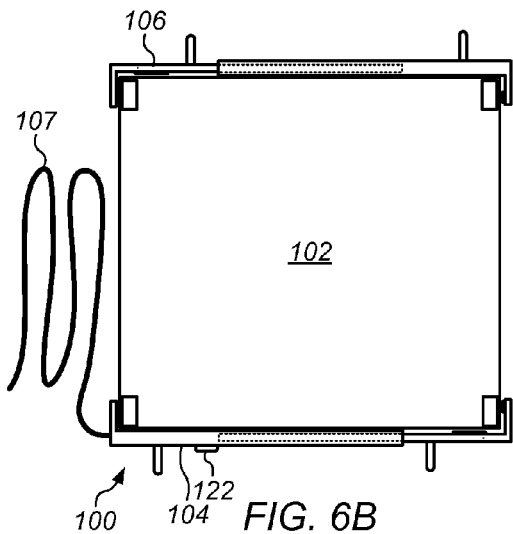

Front rack-handling device 104 may be installed on the rear of rack 102, such as shown in FIG. 6B. In some embodiments, strap 107 is pre-installed on front rack-handling device 104.

Figure 6C:
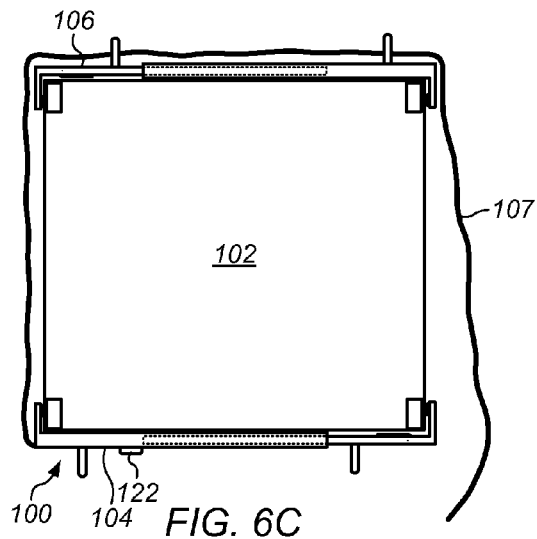
Figure 6D:
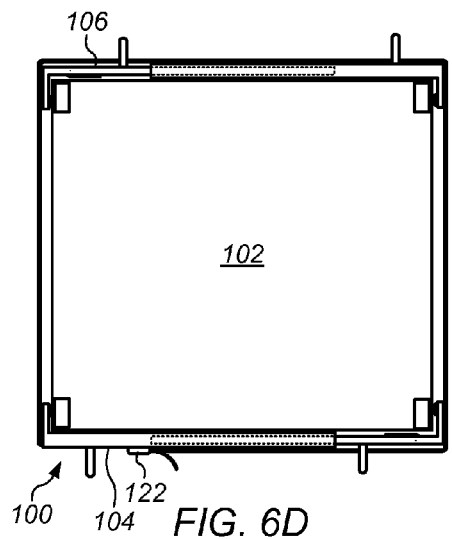

The user may feed the free end of strap 107 toward the rear of rack 102. Strap 107 may fed under the handles of rear rack-handling device 106 and then fed back toward the front of rack 102, such as shown in FIG. 6C.

Once the free end of strap 107 has been looped all the way around rack 102 and returned to front rack-handling device 104, the free end of strap 107 may be installed in cam buckle mechanism 122. The user may tension strap 107 around rack 102 to create a firm engagement of front rack-handling device 104 and rear rack-handling device 106 on rack 102. Once rack-handling system 100 has been fully installed, users may use handles on front rack-handling device 104, rear rack-handling device 106, or both, to move the rack. In some embodiments, the rack is rolled on the floor of a computing room.

Figure 7:
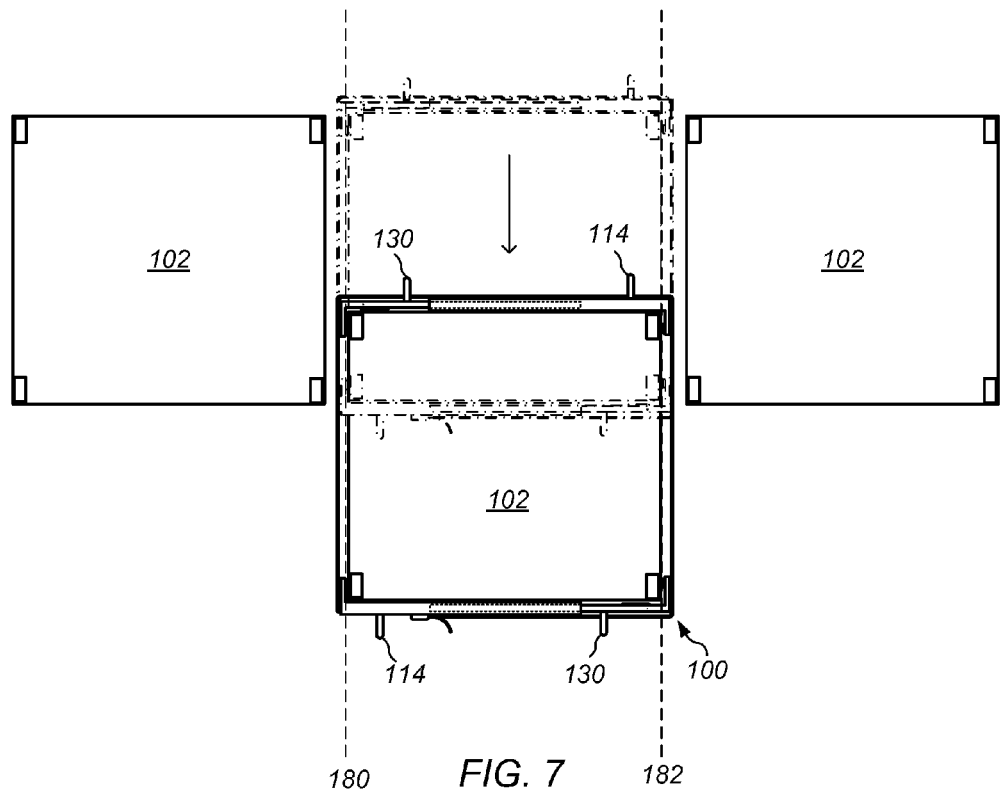
FIG. 7 illustrates one embodiment of removal of a rack from a row of racks using a rack-handling system.

In some embodiments, a rack is extracted from a row of rack using a rack-handling system. FIG. 7 illustrates one embodiment of removal of a rack from a row of racks using a rack-handling system. The rack-handling system may be such as rack-handling system 100 described above relative to FIGS. 1-4. Rack 102 may be moved from the in-row position shown by phantom lines to a withdrawn position, such as shown in the solid lines.

In various embodiments, handles of a rack-handling device are located between the left and right boundary planes of a rack when the rack-handling device is mounted on the rack. As used herein, a "boundary plane" means an imaginary plane that passes through the extreme portions of a rack frame or cabinet on one side or face of a rack. A boundary plane extends forever in all directions. In the embodiment shown in FIG. 7, for example, handles 114 and handles 130 are located between left boundary plane 180 and right boundary plane 182. In some embodiments, handles are located such that a user's hands remain with the side boundary planes of a rack during use of the handles to move the rack. Thus in the embodiment shown in FIG. 7, the users' hands may remain clear of the adjacent racks as the rack is pushed and/or pulled out of the rack row.

Figure 8:
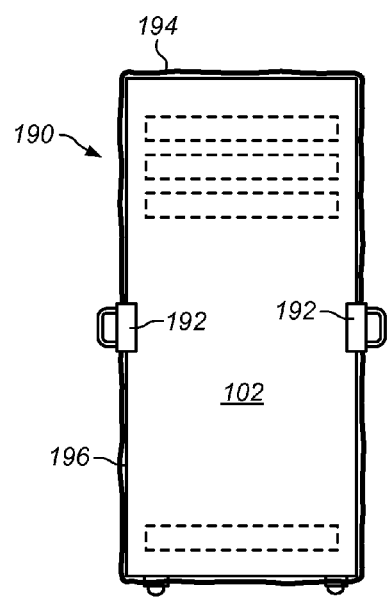
FIG. 8 illustrates one embodiment of a rack handling system with linking members over and under rack.

In the embodiments described above relative to FIGS. 1-4 and FIG. 6A-6D, a linking member of a rack-handling system went around the sides of a rack. Linking members of rack-handling system may nevertheless in some embodiments take a different path from one end of the rack to the other. In various embodiments, a linking member between rack handle devices may go over a rack, under a rack, or through a rack. FIG. 8 illustrates one embodiment of a rack handling system with linking members over and under the rack. Rack handling system 190 includes rack-handling devices 192, upper strap 194, and lower strap 196. Upper strap 194 passes over rack 102 and links front and rear rack-handling devices 192. Lower strap 196 passes under rack 102 and links front and rear rack-handling devices 192. One or both of upper strap 194 and lower strap 196 may be placed in tension to inhibit separation of rack-handling devices 192 during use of the rack-handling system to move rack 102. In certain embodiments, a single strap may extend from one rack handling device over the rack and then return under the rack to the same rack-handling device.

Figure 9:
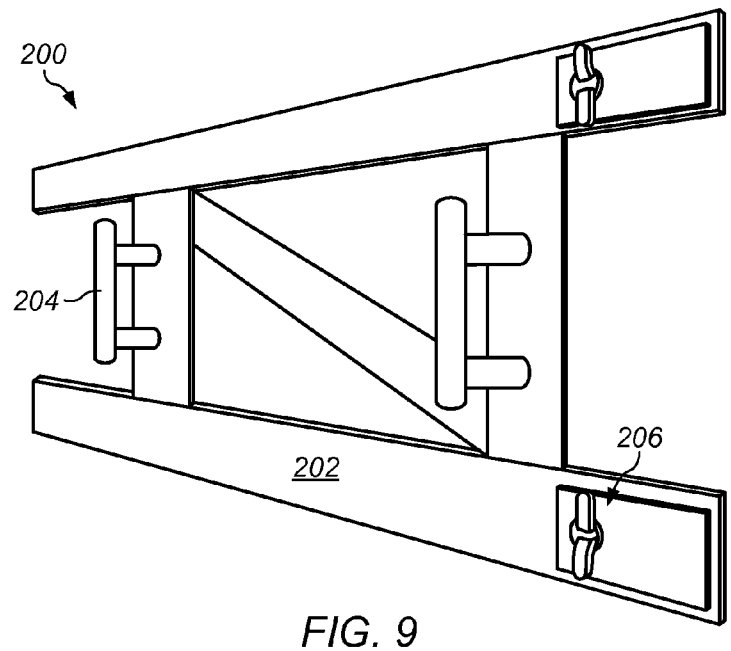
FIG. 9 illustrates one embodiment of a rack handling device that can be coupled in an opening of a rack.
Figure 10:
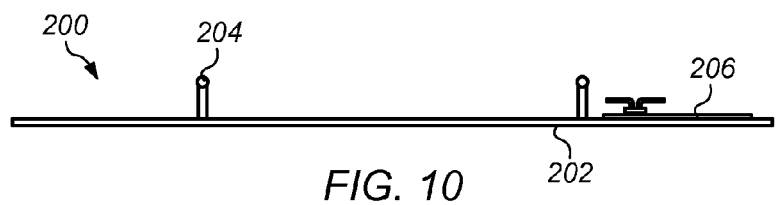
FIG. 10 is a top view of a rack-handling device that can be coupled in an opening of a rack.

In some embodiments, a rack-handling system couples to the inside of a rack structure. In one embodiment, a rack-handling device couples on the interior side of a frame of the rack. FIG. 9 illustrates one embodiment of a rack handling device that can be coupled in an opening of a rack (for example, a front or rear opening). FIG. 10 is a top view of the rack-handling device shown in FIG. 9. Rack-handling device 200 includes rack handling device frame 202, handles 204, and locking mechanism 206.

Figure 11:
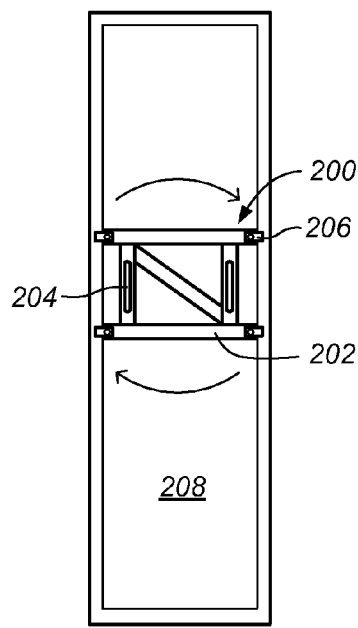
FIG. 11 illustrates a rack-handling device in installed in an opening in a rack.

In some embodiments, a rack-handling device is reoriented after it is placed in an opening of a rack. FIG. 11 illustrates installation of a rack-handling device in an opening in a rack. Initially, rack-handling device 200 may be advanced into an opening of rack 208 such that the rack-handling device is oriented lengthwise vertically (for example, 90 degrees counter-clockwise from that shown in FIG. 11. After rack-handling device 200 is advanced into the opening, rack-handling device 200 may rotated in the direction of the arrows shown in FIG. 11. Locking mechanism 206 may be adjusted such that rack-handling device 200 spans the opening of rack 208 and engages on the structure of the rack adjacent to the opening (for example, the frame of the rack). Once rack-handling device 200 has been installed in the opening, handles 204 may be used to move rack from one location to another. In some embodiments, rack 208 is rolled on the floor (for example, on casters).

Figure 12:
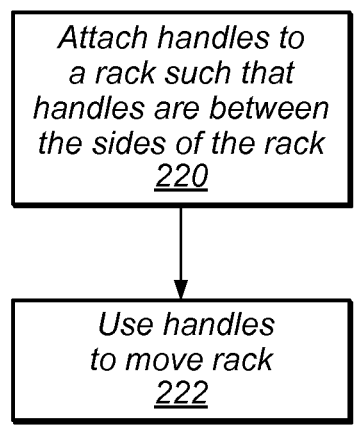
FIG. 12 illustrates one embodiment of moving a rack using removable handles.

In some embodiments, moving a rack includes attaching one or more handles such that a user hands can remain between the sides of the rack when the handles are gripped, and moving the rack from one location to another. FIG. 12 illustrates one embodiment of moving a rack using removable handles. At 220, one or more handles are attached to a rack such that the handles are between the sides of the rack. In some embodiments, handles are attached to opposite ends of the rack (for example, front and back, or left side and right side). The handles on the opposing ends of the rack may be linked with one another. In some embodiments, the linking members inhibit separation of the handles from the rack during use. In certain embodiments, the linking members are placed under tension (for example, by cinching up a strap).

At 222, the handles are used to move the rack from one location to another. Each user may grip the handles such that the user's hands remain between the left and right side boundary planes of the rack. In some embodiments, the rack is rolled (for example, on casters on the rack.). In various embodiments, a rack may be withdrawn from a row of racks, installed in a row of racks, or moved from one part of a computing room to another.

Although in the embodiments described herein, only one rack-handling device is mounted each side of the rack (for example, one on the front, the other on the back), a rack-handling system may in some embodiments include two or more rack-handling devices on a particular side of a rack. For example, two rack-handling devices (such as front rack handling devices 104 described above relative to FIGS. 1-4) may be installed at different height on the front of a rack. A rack-handling device may include any number of handles, in any orientation for the user to grip.

The various methods as illustrated in the Figures and described herein represent exemplary embodiments of methods. The order of methods may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A rack-handling system, comprising:
    two or more rack-handling devices configured to mount on a rack such that the two or more rack-handling devices can be used to move the rack when the rack comprises a plurality of rack-mounted servers mounted in a rack frame of the rack, wherein at least two of the rack-handling devices comprise:
        a rack-coupling portion configured to couple to the rack; and
        one or more handles coupled to the rack-coupling portion; and
    one or more linking members configured to couple with at least two of the rack-handling devices when the at least two rack-handling devices are mounted on the rack, wherein at least one of the linking members is configured to link at least two of the rack-handling devices with one another or to inhibit separation of the at least two rack-handling devices from the rack when the at least two rack-handling devices are used to move the rack.

2. The rack-handling system of claim 1, wherein at least one of the rack-handling devices is configured to mount at a front opening in the rack and at least one other of the rack-handling devices is configured to mount at a back opening of the rack.

3. The rack-handling system of claim 1, wherein the one or more linking members comprises at least one flexible member, wherein the at least one flexible member is configured to couple to the at least two rack-handling devices.

4. The rack-handling system of claim 3, further comprising at least one tensioning device configured to tension the flexible member on the rack.

5. The rack-handling system of claim 3, further comprising at least one ratchet mechanism configured to increase tension in the flexible member on the rack.

6. The rack-handling system of claim 1, wherein at least one of the rack-handling devices is adjustable to mount on racks of differing widths.

7. A rack-handling system, comprising:
    one or more rack-handling devices configured to mount on a rack such that the one or more rack-handling devices can be used to move the rack when the rack comprises a plurality of rack-mounted servers mounted in a rack frame of the rack, wherein at least one of the rack-handling devices comprises:
        a rack-coupling portion configured to couple to the rack; and
        one or more handles coupled to the rack-coupling portion, wherein at least one of the handles is configured to be gripped by a user to move the rack from one location to another when the rack-coupling portion is coupled to the rack.

8. The rack-handling system of claim 7, wherein at least one of the handles of at least one of the rack handling devices is located between a left boundary plane of the rack and right boundary plane of the rack when the at least one rack handling device is mounted on the rack.

9. The rack-handling system of claim 7, wherein the one or more handles comprise two or more handles, wherein at least two of the handles on at least one of the rack handling devices are located between a left boundary plane of the rack and right boundary plane of the rack when the at least one rack handling device is mounted on the rack.

10. The rack-handling system of claim 7, wherein at least one of the rack-handling devices is configured to span across at least a portion of a front opening in the rack or a back opening in the rack.

11. The rack-handling system of claim 7, wherein at least one of the rack handling devices is configured to couple on an interior of the rack frame of the rack.

12. The rack-handling system of claim 7, wherein at least one of the rack-handling devices comprises an adjustable width.

13. The rack-handling system of claim 7, wherein the rack-coupling portion of at least one of the rack-handling devices comprises two or more members configured to slide with respect to one another, wherein the two or more members are configured to adjust to racks of different widths.

14. The rack-handling system of claim 7, wherein at least one of the rack-handling devices comprises a spring mechanism configured to bias at least one member of a rack-coupling portion into engagement with the rack to inhibit separation of the rack-handling device from the rack when the rack-handling device is installed on the rack.

15. The rack-handling system of claim 14, wherein the spring mechanism comprises a constant force spring.

16. The rack-handling system of claim 7, wherein the at least one of the rack-handling devices is configured to rotate into place in an opening in the rack.

17. The rack-handling system of claim 7, wherein the at least one of the rack-handling devices is configured to couple on an interior of the rack frame.

18. The rack-handling system of claim 7, further comprising a securing mechanism configured to secure at least one of the rack-handling devices to the rack.

19. The rack-handling system of claim 7, further comprising one or more flexible members configured to couple with at least one of the rack-handling devices when the at least one rack-handling device is mounted on the rack, wherein at least one of the flexible members is configured to inhibit separation of the at least one rack-handling device from the rack when the at least one rack-handling device is used to move the rack.

* * * * *